United States Patent [19]
Ohnishi et al.

[11] Patent Number: 4,936,968
[45] Date of Patent: Jun. 26, 1990

[54] ION-BEAM MACHINING METHOD AND APPARATUS

[75] Inventors: Tsuyoshi Ohnishi, Kokubunji; Tohru Ishitani, Sayama; Yoshimi Kawanami, Fuchu, all of Japan

[73] Assignee: Hitachi, Ltd., Tokyo, Japan

[21] Appl. No.: 324,657

[22] Filed: Mar. 17, 1989

[30] Foreign Application Priority Data

Mar. 18, 1988 [JP] Japan ................................. 63-63241

[51] Int. Cl.$^5$ ............................................. C23F 1/02
[52] U.S. Cl. ............................. 204/192.34; 156/345; 156/643; 250/492.3; 204/298.36
[58] Field of Search ................. 204/192.34, 298 BE; 250/492.21, 492.3; 156/345, 643; 219/121.7, 121.71

[56] References Cited

U.S. PATENT DOCUMENTS 4,457,803 7/1984 Takigawa ........................... 156/626
4,523,971 6/1985 Cuomo et al. ...................... 156/345
4,639,301 1/1987 Doherty et al. ................. 204/192.31

OTHER PUBLICATIONS

R. L. Seliger et al., *J. Vac. Sci. Technol.*, vol. 16 (6), pp. 1610–1612 (1979).
C. M. Melliar-Smith, *J. Vac. Sci. Technol.*, vol. 13, No. 5, pp. 1008–1022 (1976).
R. E. Lee, *J. Vac. Sci. Technol.*, vol. 16 (2), pp. 164–170 (1979).
L. R. Harriott et al., *J. Vac. Sci. Technol.*, vol. B5 (1), Jan./Feb. 1987, pp. 207–210.

Primary Examiner—Aaron Weisstuch
Attorney, Agent, or Firm—Antonelli, Terry & Wands

[57] ABSTRACT

In an ion-beam machining method and apparatus of effecting sputtering by deflecting a focused ion beam and scanning it on a material surface, the relationship between the diameter d of the beam on the material surface and the height h of a stepped portion formed by each beam scan is changed from $h \geq d$ to $h << d$ in accordance with an increase in the depth of a hole which is being formed, to thereby control the number of sputtered particles redeposited on side walls of the hole. The apparatus includes a deflection controller for controlling an ion beam deflector and blanking electrode so as to change the above-mentioned relationship between d and h.

17 Claims, 7 Drawing Sheets

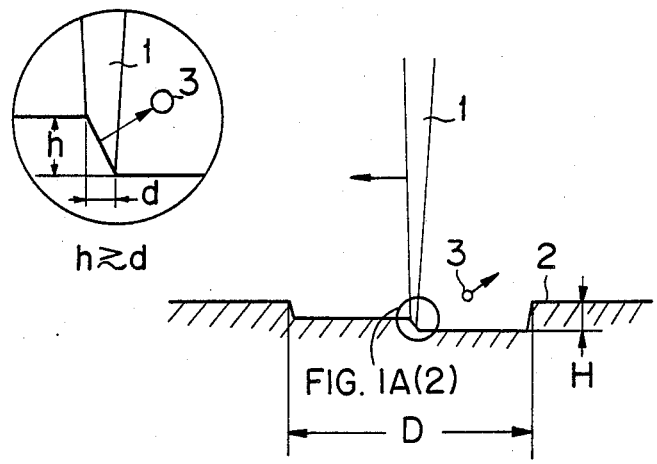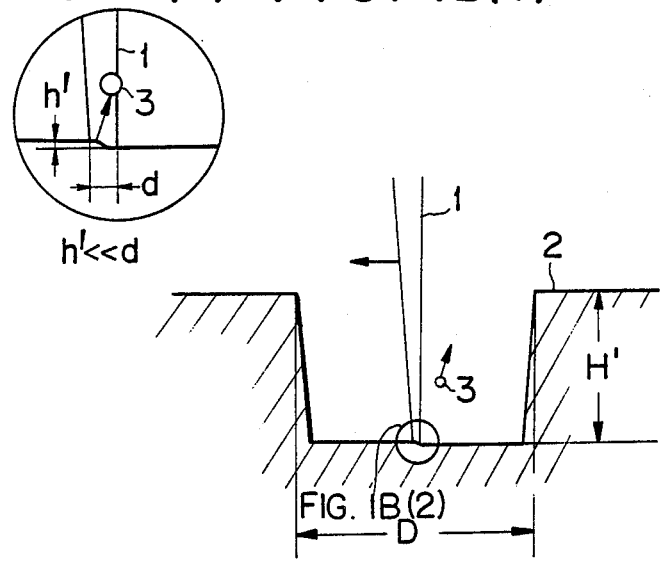

ION-BEAM MACHINING METHOD AND APPARATUS

BACKGROUND OF THE INVENTION

The present invention relates to a process for forming holes by means of a focused ion beam (FIB) and, more particularly, to a method of effecting, at high speeds, ion beam machining which can form holes having good configurations, as well as an apparatus suitable for use with the method.

A typical prior art is described in *J. Vac. Sci. Technol. B*5(1), January/February 1987, pages 207-210 (hereinafter referred to as "document 1").

The document 1 proposes the following three points in connection with a case where a material 2 is sputtered by using such a focused ion beam 1 as shown in FIG. 2:

(1) If the relationship between a beam diameter d on the material 2 and a depth h of a hole which is formed in each step of irradiation with a focused ion beam is selected to be $h < d$, then it is possible to reduce the amount of sputtered material redeposited on side walls of a hole which is being formed;

(2) If the direction of beam sweep is reversed after each pass, asymmetrical redeposition can be eliminated; and (3) The redeposition onto the side walls can be compensated for by utilizing the dependency of a sputtering yield upon the incidence angle of a beam.

The proposal (1) takes account of the fact that, under the condition of $h > d$, the size of a stepped portion of the hole which is being formed becomes large and, if the stepped portion is sputtered, a major part of the sputtered material tends to be scattered in oblique directions and redeposited on the side walls of the hole.

The proposal (2) is made in order to average the amount of obliquely scattered material by reversing the direction of beam sweep to make uniform the redeposition on the side walls of the hole, thereby keeping symmetrical the configuration of the hole which is being formed.

The proposal (3) is made on the basis of the relationship, shown in FIG. 3, between an incidence angle and a sputtering yield disclosed in "Sputtering Phenomenon" by Akira Kinbara, published by Tokyo Daigaku Shuppankai, Page 26 (hereinafter referred to as "document 2"). More specifically, the proposal (3) is based on a thought that since a beam is incident, at an equivalently large angle, upon the material redeposited on the side wall, the sputtering rate is high (the redeposited material is removed immediately).

The above-described prior art excels in that it clarifies the fact that formation of holes free from the redeposition of a large number of sputtered particles can be conducted under the processing 1 condition of $h < d$. However, the prior art fails to take account of the necessity to realize a high-speed process under the condition of $h > d$.

SUMMARY OF THE INVENTION

It is an object of the present invention to provide an ion-beam fabrication method which is capable of forming holes having good configurations at high speeds.

The above object can be achieved by the present invention in which the relationship between the depth h of a hole formed by each step of beam irradiation and the diameter d of a beam focused on a material is changed from $h \geq d$ into $h < < d$ according to the increase in either the depth H of the hole which is being formed or an aspect ratio (the ratio of the depth H to the diameter D of the hole which is formed). Alternatively, the object can also be achieved by a method in which the trajectory of a focused ion beam which scans a material is caused to intersect, approximately perpendicularly, a line normal to the side wall of the hole which is closest to the trajectory and the beam is deflected such that the intersection point of the trajectory and the normal is sequentially moved along the normal toward the side wall.

FIGS. 4A and 4B are cross-sectional views each of which shows the manner of sputtering while a hole is being formed in the material 2 by irradiating it with a focused ion beam 1. FIG. 4A shows a case where the beam-sweep condition is $h < < d$, with FIG. 4B showing a case where the condition is $h \geq d$.

In the sputtering shown in FIG. 4A, wherein the beam-sweep condition is $h < < d$, a micro step 5 which has been formed by the preceding beam-sweep is small and the incidence angle of the beam 1 with respect to the material 2 is considered to be approximately zero (0) degrees. Accordingly, the matter (sputtered particles) 3 which is scattered by sputtering shows an angular distribution, such as a cosine distribution, a Gauss distribution, or a $cos^2$ distribution, which has its intensity center in the direction parallel to a normal of the surface of the material 2. Accordingly, it is possible to minimize the number of sputtered particles 3 redeposited on a side wall 4 of the hole which is being formed.

In the sputtering shown in FIG. 4B, wherein the beam-sweep condition is $h \geq d$, the size of the micro step 5 formed is large, and the incidence angle of the beam 1 with respect to the material 2 is locally inclined. Accordingly, the intensity center of the sputtered particles 3 makes a certain angle with respect to the normal of the material surface, that is to say, the side wall 4 of the hole which is being formed exists in the direction of the intensity center. Accordingly, the sputtered particles 3 collide with the side wall 4, and the proportion of redeposited particles increases. However, as can be seen from the data shown in FIG. 3, as the incidence angle of the beam with respect to the material 2 increases, the sputtering yield S is improved and the total amount of material sputtered becomes large compared to the case of $h < < d$.

In the case of a process for forming a hole in a flat material by deflecting a focused ion beam and irradiating the flat material with the focused ion beam thus deflected, in an initial step in which the depth of the hole which is being formed is small and the aspect ratio (the ratio of the depth H to the diameter D of the hole which is formed) is low, sputtered particles may be scattered in oblique directions but the proportion of sputtered particles which collide with the side walls of the hole is small, since a wall surface has not yet been formed in the way in which the sputtered particles are scattered. Accordingly, in such an initial step, it is possible to form the hole at a high speed under the beam-sweep condition of $h \geq d$. As the depth H of the hole becomes large and the aspect ratio becomes high, a wall surface is formed in the way in which the sputtered particles are scattered, so that the proportion of sputtered particles which collide with the side wall of the hole increases. Therefore, it is necessary to minimize the number of particles redeposited under the beam-sweep condition of $h < < d$.

Accordingly, it is possible to form, at a high speed, a hole having a good configuration free from the redeposition of a large amount of matter by carrying out the process under the condition of $h \geq d$ in an initial stage of the process, and then effecting sweeping of a beam under the condition of $h < < d$ in a later stage in which the aspect ratio is high, for example, 0.5 or more.

Typical parameters used to alter such a condition are: (a) the beam's stationary time, (b) a current density, and (c) beam diameter of a focused ion beam (FIB) on a material. The beam's stationary time may be controlled by altering the deflection pitch of the beam with its scan speed kept constant. In order to alter the current density and the beam diameter, a variable aperture and a zoom lens may be utilized so that the relationship between the physical positions of the beam-forming optical systems or the size of an aperture may be changed.

In addition, it is possible to achieve an even greater improvement in the forming accuracy by scanning a focused ion beam from the center towards the radially outer zone of a hole which is being formed. That is to say, the focused ion beam may preferably be scanned so that the trajectory of the focused ion beam which is scanning a material approximately perpendicularly intersects a normal of the side wall of the hole which is closest to a point irradiated by the beam so that the intersection point of the trajectory and the normal sequentially approaches the aforesaid side wall. In this manner, it is possible to reduce the number of sputtered particles redeposited on the side walls of the hole. This is because the process can proceed such that the surface of a stepped portion, which is formed by irradiation with the focused ion beam, always faces in the direction opposite to the closest side wall of the hole which is being formed.

BRIEF DESCRIPTION OF THE DRAWINGS

FIGS. 1A and 1B are diagrammatic crosssectional views which illustrate one embodiment of the present invention;

DESCRIPTION OF THE PREFERRED EMBODIMENTS

Preferred embodiments of the present invention will be described below with reference to the accompanying drawings.

EMBODIMENT 1

Figure 2:
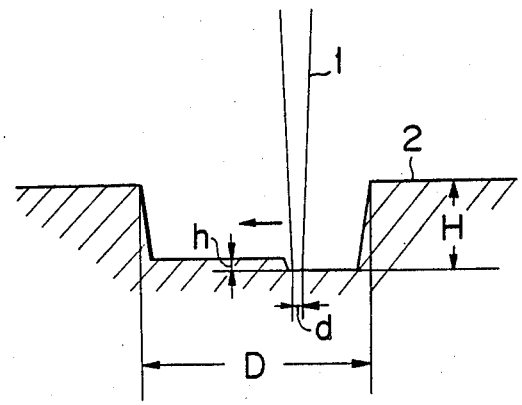
FIG. 2 is a diagrammatic cross-sectional view of a hole being formed, which illustrates the concept of FIB fabrication.
Figure 3:
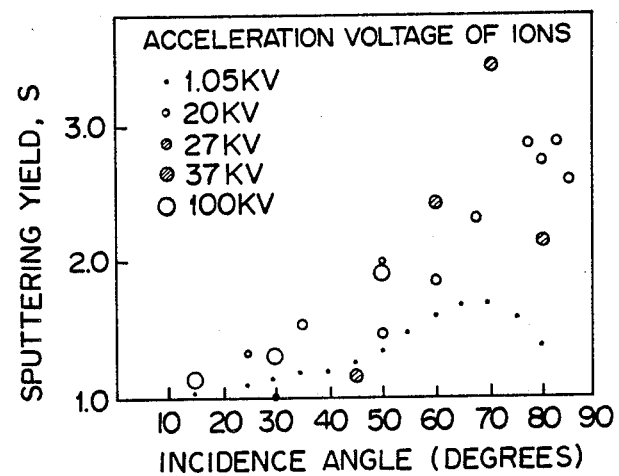
FIG. 3 is a graph of experimental data, which illustrates the relationship between incidence angle and sputtering yield.
Figure 4A:
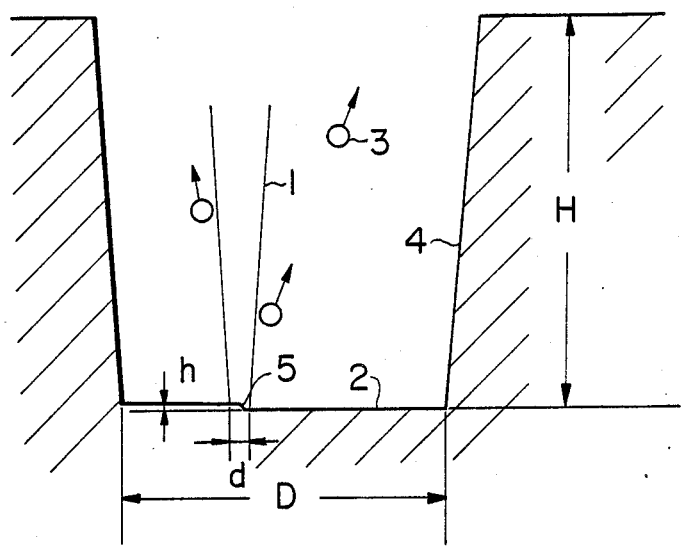
FIGS. 4A and 4B are diagrammatic cross-sectional views of worked models, which respectively serve to illustrate the principle of the present invention.
Figure 4B:
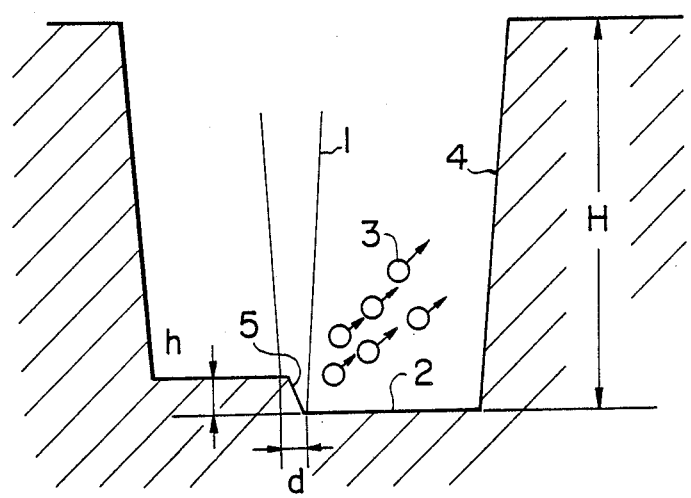
Figure 5:
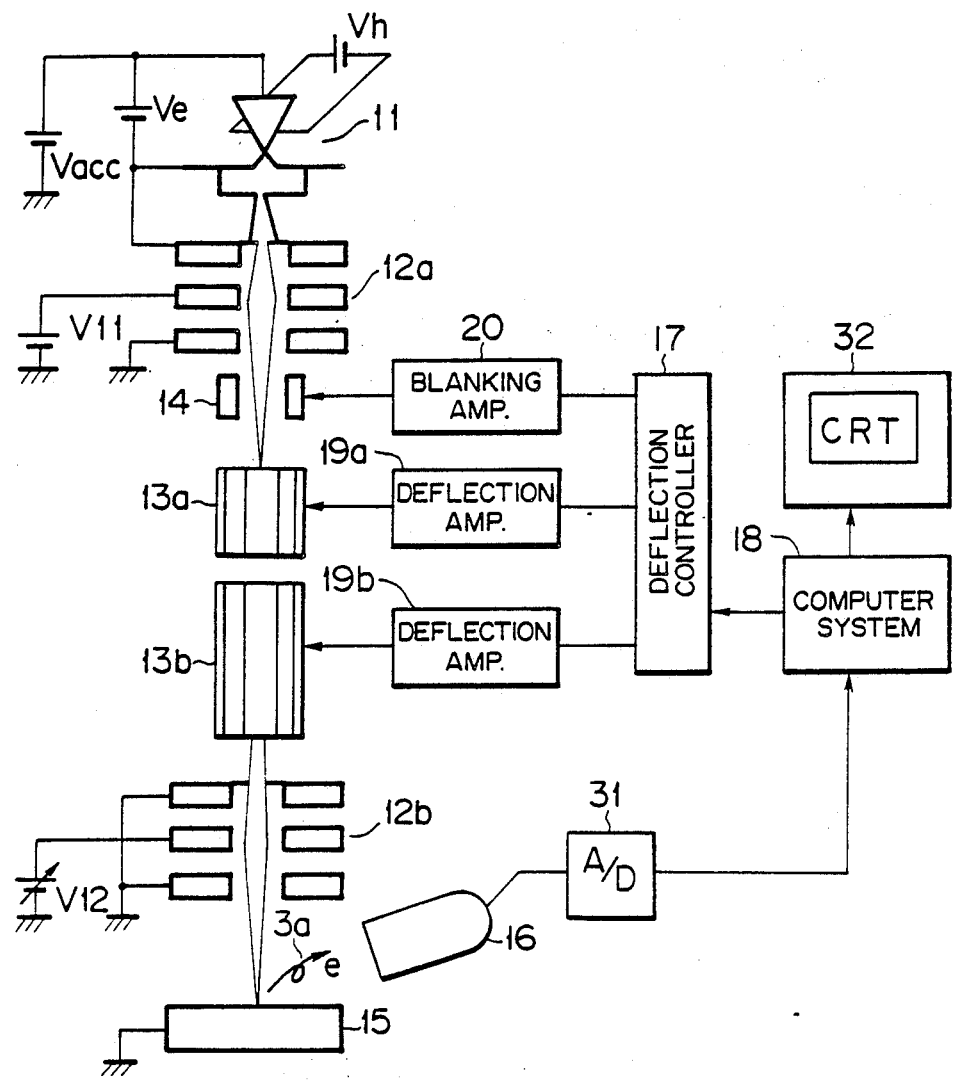
FIG. 5 is a block diagram showing the construction of a focused-ion-beam system used in the present invention.

FIG. 5 is a diagrammatic view showing the construction of an example of a focused ion beam system for use with the present invention. In this embodiment, the relationship between the magnitudes of h and d is controlled by changing the beam's stationary time at each deflection point. An optical system is constituted by a Ga liquid metal ion source 11, electrostatic lenses 12a and 12b, octopole deflectors 13a and 13b and blanking electrodes 14 and is operable with an acceleration voltage of 30 kV. Beam deflection is generally controlled by a computer system 18. Deflection signals are applied to respective deflectors 13a and 13b through a deflection controller 17 and corresponding deflection amplifiers 19a and 19b, while a blanking signal is applied to the blanking electrodes 14 through the deflection controller 17 and a blanking amplifier 20. The optical system having the above-described construction is used to effect switching and scanning of a focused ion beam FIB, thereby working a material on a table 15 into a desired shape.

Electrons 30 which are secondarily emitted by beam irradiation are converted into a luminance signal by a secondary electron detector 16, input into the computer system 18 through an A/D converter 31, and displayed on a cathode ray tube (CRT) 32 as a scanning ion microscope (SIM) image. This image is used to effect, for example, the positioning required for formation of a hole. Incidentally, in FIG. 5, "Vh" represents a heater supply, "Ve" is an extraction supply, "Vacc" is an acceleration supply, and "Vl$_1$" and "Vl$_2$" are lens supplies.

In place of the afore-said Ga liquid metal ion source, it is possible to use any kind of ion source which can effect sputtering of a material, such as an Au or liquid metal ion source and an electric-field ionization type of gas ion source.

Figure 6:
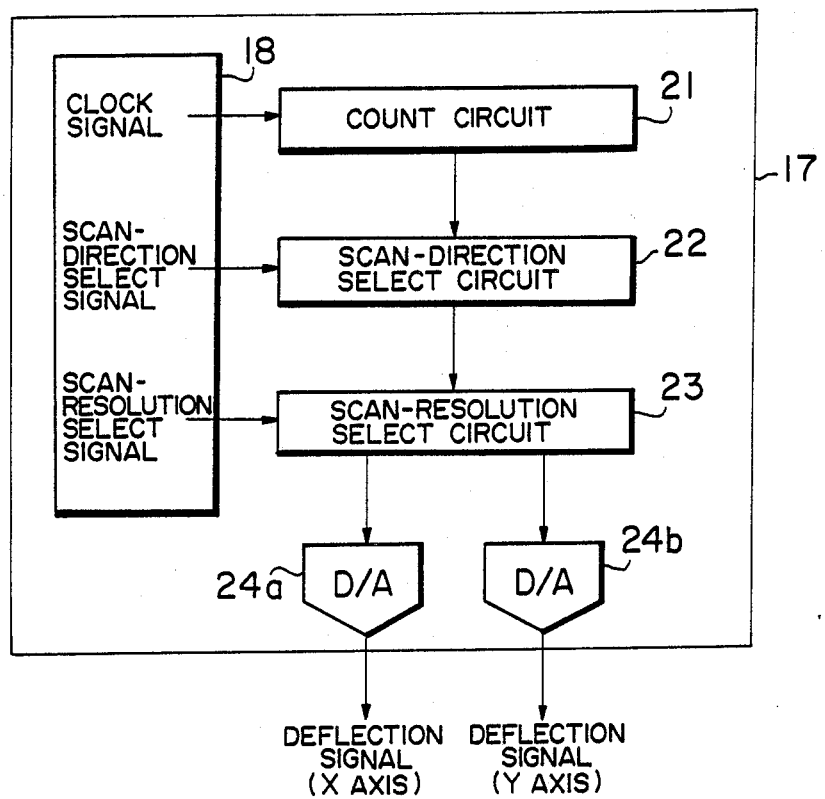
FIG. 6 is a block diagram of the internal arrangement of a deflection controller of the focused-ion-beam system used in the present invention.

FIG. 6 is a block diagram which serves to illustrate the interior of the deflection controller 17. A deflection signal in the X-axis direction and a deflection signal in the Y-axis direction are generated by a D/A converter 24a and a D/A converter 24b, respectively. In this case, the input digital data of the D/A converters 24a and 24b are generated through a count circuit 21, a scan direction select circuit 22 and a scan resolution select circuit 23. The period of a clock signal supplied from the computer system 18 to the count circuit 21 corresponds to the beam's stationary time at each deflection point. The amount of beam irradiation can be adjusted by adjusting the beam's stationary time. Thus, the number of sputtered atoms at each deflection point is adjusted so that the relationship between the magnitudes of h and d can be controlled. The scan direction select circuit 22 is capable of freely selecting the desired beam scan direction from the X-axis direction and the Y-axis direction by inverting the beam deflection position data output from the axis, and vice versa. The scan resolution select circuit 23 serves to set the pitch of the movement of a beam spot (the spacing between the points of adjacent beam spots or adjacent scanning lines) and, in order to work the surface of the material into a flat surface, it is necessary that the beam spot pitch be made smaller than the beam diameter.

FIGS. 1A and 1B show an example of a hole forming process which is conducted on an Si substrate 2 by means of the above-described focused-ion-beam system. FIG. 1A shows an initial step of the process in which the depth of a hole being formed is small, while FIG. 1B shows a final step of the process in which the depth of the hole is large. The final configuration of the formed hole is 5 $\mu$m $\times$ 5 $\mu$m (opening area) $\times$ 3 $\mu$m (depth). The beam diameter d of a focused ion beam 1 is set to be 0.1 $\mu$m.

In the step shown in FIG. 1A, the condition of $h \geq d$ is established by making the period of a deflection clock as long as 5 ms, and the travel pitch of the focused ion beam 1 is set to be 0.05 $\mu$m ($\frac{1}{2}$ of the beam diameter d) by the selection of scan resolutions so that a micro step of the material 2 can be efficiently irradiated with the focused ion beam 1. Thus, the speed of the hole formation is improved.

In the step shown in FIG. 1B, the deflection clock period is set to be 1 $\mu$s and the formation of the hole is performed under the condition of $h << d$. The beam travel pitch is set to be 0.01 $\mu$m. Thus, under the condition of d, it is possible to minimize the amount of matter 3 redeposited on the side walls of the hole which is being formed and, in addition, to realize even more uniform irradiation with the focused ion beam 1. Furthermore, the scan direction select circuit 22 is used to change the scan direction each time one surface scan is effected, thereby uniformly scattering the redeposited substance 3 (whose amount of deposition is small) toward all the side walls (in this example, four side walls). The resultant formed hole has a good and symmetrical configuration.

The selection of deflection modes shown in FIGS. 1A and 1B is performed at the time when the depth of the hole which is being formed reaches 1.5 $\mu$m which is determined based on the beam irradiation time. In place of the above-described step control, however, the relationship between the magnitudes of h and d may be changed by continuously changing the clock period in accordance with an increase in the depth of a hole which is being formed.

EMBODIMENT 2

In the first embodiment, the depth of the hole to be formed is controlled in correspondence with only the passage of the beam irradiation time. However, the depth of such a hole may be estimated by using the integrated value of a beam current or a material current. More specifically, if a material to be sputtered is homogeneous and the beam-sweep conditions are fixed, then the sputtering yield S is constant and, therefore, the rate of sputtering is proportional to the value of the beam current. If the material to be sputtered is homogeneous, the material current is proportional to the beam current.

Accordingly, if the beam current or the material current is monitored, then the sputtering rate can be measured. Therefore, by integrating the beam current or the sample current, the amount of material sputtered can be determined and, hence, the depth of the hole which is being formed can be estimated. Incidentally, typical integrating methods are: (1) an analog method using an analog integrator and (2) a digital method using sampling and addition.

Figure 9:
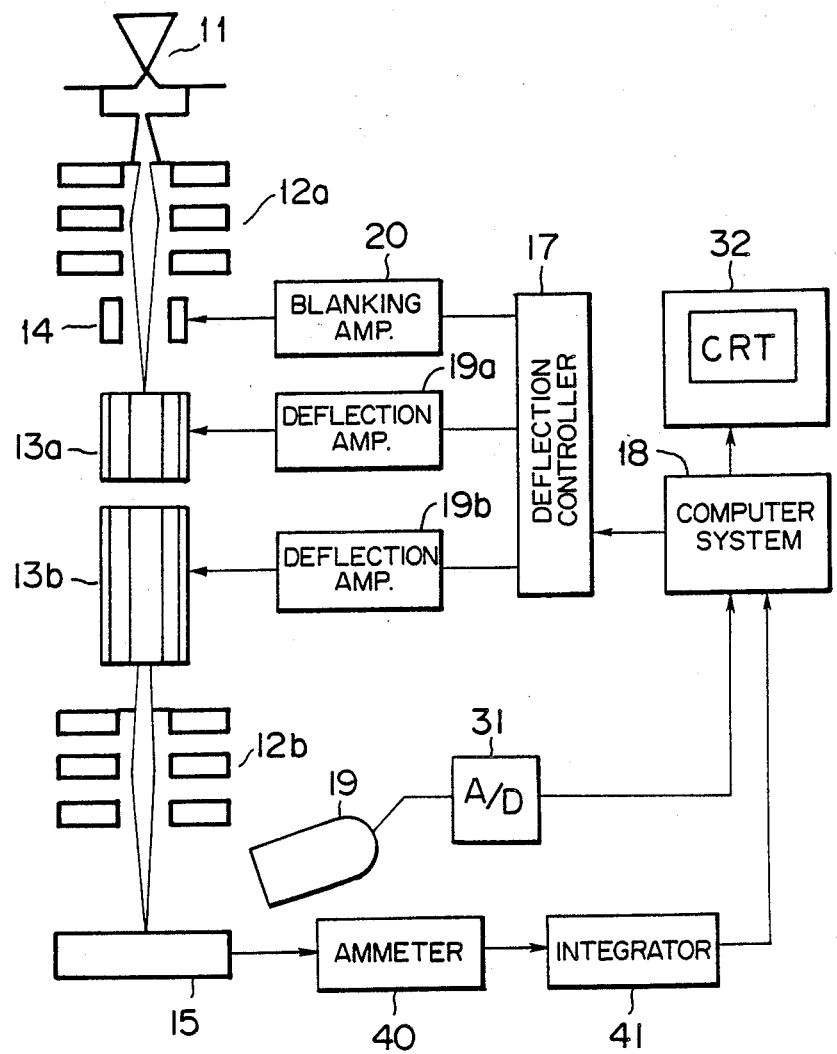
FIG. 9 is a block diagram showing the construction of another focused-ion-beam system used in the present invention.

As shown in FIG. 9, the second embodiment is carried out by monitoring a beam current or a material current by an ammeter 40, integrating the result of monitoring by means of an integrator 41, and estimating, by the computer system 18, the depth of a hole which is being formed. The arrangement of the part of the second embodiment is substantially identical to that of the corresponding portion shown in FIG. 5.

EMBODIMENT 3

In each of the above-described embodiments, the depth of a hole to be formed is used as a parameter, and the relationship between the magnitudes of h and d is changed from $h \geq d$ to $h << d$ in accordance with an increase in the depth of such a hole. In a process for forming at least two holes having different configurations, the aspect ratio of each hole to be formed can be used as a parameter to achieve a high-precision formation of holes collectively. This is because even if a plurality of holes are formed to the same depth H, the numbers of sputtered particles deposited on the side walls of the holes vary dependent upon the diameters D of the individual holes which are being formed. If the configuration of each hole to be formed is a simple circle or a rectangle, the diameter or the length of one side of each hole may be utilized as the parameter D. If the configurations of such holes are complicated, a method can be employed in which, for example, the diameter of a circle having the same area is used as the parameter D. With the third embodiment, if the aspect ratio becomes high (for example, $\frac{1}{2}$ or more), then the relationship between the magnitudes of h and d may be switched. Alternatively, the relationship may be continuously changed according to the aspect ratio. Thus, holes having different configurations can be formed all with improved accuracy.

EMBODIMENT 4

Redeposition of sputtered particles onto side walls of a hole which is being formed undergoes variations, depending upon the configuration of the hole, the direction of beam scan, and so forth. This is because the probability of redeposition depends upon the distance between the inclined surface of a stepped portion which is formed by irradiation with a focused ion beam and the associated wall surface of the hole which is being formed.

Figure 7:
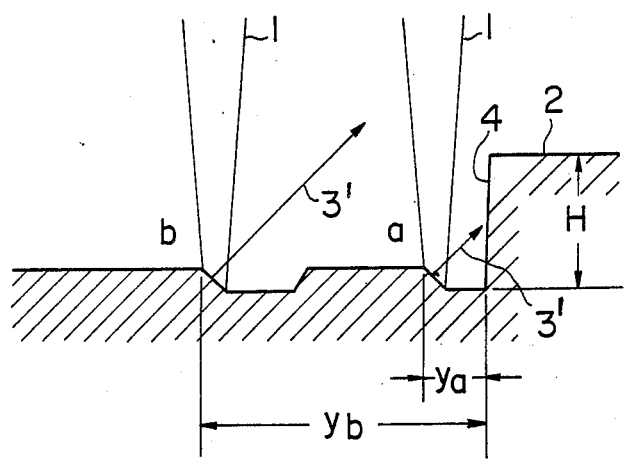
FIG. 7 is a diagrammatic cross-sectional view of a hole being formed, which illustrates the correspondence between positions irradiated by beams and the resultant amounts of redeposition.

The principle of the fourth embodiment is illustrated in FIG. 7, wherein y represents the distance between the irradiation point of the focused ion beam 1 and the facing side wall of a hole which is being formed and H represents the height of the side wall of the hole. It will be appreciated that the greater the value of H/y, the greater the probability of redeposition of sputtered particles. In FIG. 7, the intensity center of sputtered particles in the direction of the cast thereof is represented at 3'. In this embodiment, a region which shows a large H/y is processed under the beam-sweep condition of $h << d$ and, as the value of H/y becomes smaller, the relationship between h and d is changed to the condition of $h \geq d$. Thus, it is possible to achieve both a reduction in the number of sputtered particles redeposited during the formation of holes and an improvement in the speed of hole formation. In practice, the apparatus shown in FIG. 5 is used to change the period of a clock signal and a deflection pitch in correspondence with a beam irradiation point and a scan direction.

EMBODIMENT 5

In order to further decrease the number of sputtered particles redeposited on the side walls of a hole which is being formed, the direction of the inclined surface of a stepped portion which is formed by irradiation with a focused ion beam is also important. More specifically, if the focused ion beam is scanned such that the inclined surface of the stepped portion which is formed by irradiation with the focused ion beam is always directed away from the side wall of the hole which is closest to the beam irradiation point, it is possible to further decrease the number of sputtered particles redeposited on the side walls of holes to be formed.

Figure 8A:
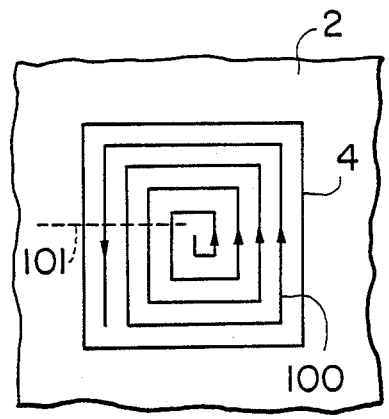
FIGS. 8A and 8B are top plan views of materials which respectively show the trajectories of beams which contribute to a reduction in the amount of redeposition.
Figure 8B:
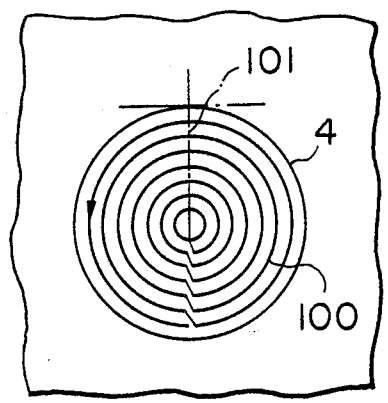

As shown in FIGS. 8A and 8B, a trajectory 100 of a beam which scans the material 2 intersects, approximately perpendicularly, a line 101 normal to the wall surface 4 of the hole which is closest to the trajectory 100, and the beam is deflected so that the intersection point is moved sequentially along the normal 101 toward the wall surface 4.

Incidentally, as compared with the process for forming the rectangular hole shown in FIG. 8A, the process for forming the circular hole shown in FIG. 8B achieves a reduction in the number of the sputtered particles required to obtain the same area of an opening, as well as a further increase in the speed of the hole forming process.

EMBODIMENT 6

Figure 10:
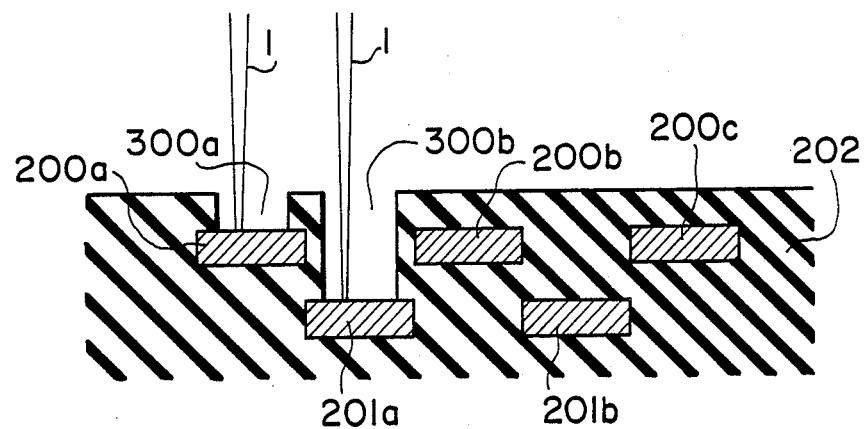
FIG. 10 is a diagrammatic cross-sectional view of a multilayered wiring structure in which holes are formed by the method of the invention.

FIG. 10 shows a sixth embodiment in which contact holes are formed in a device of two-layered wiring structure. A contact hole 300a extending to a first-layer wiring 200a and a contact hole 300b extending to a second-layer wiring 201a are formed in the device by sputtering by irradiation with a focused ion beam 1. In general, the contact hole 300b formed to the underlying second-layer wiring 201a involves a high aspect ratio and must be worked to have a good configuration in order to prevent the overlying wiring or first-layer wiring 200a from being damaged and to provide a good contact characteristic. To meet this requirement, the method of the present invention can be effectively utilized. Incidentally, such a contact hole can be utilized to, for example, correct the wiring of a device of multi-layered wiring structure or inspect large-scale integrated circuits (LSI's) by using an electron beam tester.

As can be seen from the foregoing description, the present invention provides an advantage that a high-speed sputtering can be conducted to form holes having a good configuration free from the redeposition of a large amount of sputtered particles.

What is claimed is:

1. An ion-beam machining method of effecting a sputtering of a material by deflecting a focused ion beam and scanning the focused ion beam thus deflected on a surface of said material, wherein the relationship between a beam diameter d of the focused ion beam on the surface of said material and a height h of a stepped portion of said material formed by each scan of the focused ion beam is changed from $$h \geq d$$

to $$h \ll d$$

in accordance with an increase in the depth of a hole being formed by the sputtering, whereby the amount of particles generated from the portion of said material which is irradiated by said focused ion beam and sputtered and redeposited on a side wall of the hole can be controlled.

2. A method according to claim 1 wherein said relationship between d and h is changed by changing at least one of a beam's stationary time on said material surface, a current density and the beam diameter of said focused ion beam on said material surface.

3. A method according to claim 1 wherein the depth of said hole is estimated on the basis of the irradiation time of said focused ion beam on said material surface.

4. A method according to claim 1, wherein the depth of said hole is estimated on the basis of the integrated value of one of the beam current of said focused ion beam and a current flowing in said material.

5. A method according to claim 1, wherein the pitch of deflection of said focused ion beam is selected to be smaller than the beam diameter of said focused ion beam at least under the condition of $h \ll d$.

6. A method according to claim 1, wherein the relationship between the magnitudes of d and h is controlled on the basis of the position of said hole which is irradiated by said focused ion beam.

7. A method according to claim 1, wherein the scanning of said focused ion beam is controlled such that the trajectory thereof which is scanning said material approximately perpendicularly intersects a line normal to the side wall of said hole which is closest to the irradiation point of said focused ion beam and such that the intersection point of said trajectory and said normal sequentially approaches said side wall.

8. A method according to claim 1, wherein said material is a device of multi-layered wiring structure.

9. An ion-beam machining method of effecting sputtering by deflecting a focused ion beam and scanning the focused ion beam thus deflected on a surface of a material, wherein the relationship between d and h is changed from $h \geq d$ to $h \ll d$ either continuously or in stepwise manner in accordance with an increase in the aspect ratio of a hole which is being formed, where d represents the beam diameter of said focused ion beam on the surface of said material and h represents the depth of said hole which is formed by each scan of said focused ion beam.

10. An ion-beam machining method of effecting sputtering by deflecting a focused ion beam and scanning the focused ion beam thus deflected on a surface of a material, wherein the stationary time of said focused ion beam at a deflection point on said material is shortened in accordance with an increase in the depth of a hole which is being formed to change an angle $\theta$ from $0° < \theta$ to $20° \simeq \theta$, said angle $\theta$ being made between a line normal to said material and the direction parallel to the axis of the intensity center of particles sputtered from said material surface.

11. An ion-beam machining method of forming a hole in a material by scanning a focused beam of charged particles on a surface of said material and effecting sputtering of said material, wherein said focused beam is scanned such that the trajectory thereof which is scanning the surface of said material approximately perpendicularly intersects a line normal to the side wall of said hole which is closest to the irradiation point of said focused beam and such that the intersection point of said trajectory and said normal sequentially approaches said side wall.

12. In a focused ion beam apparatus which comprises an ion source, a lens system for focusing an ion beam supplied from said ion source, a deflector for deflecting said ion beam, and a blanking electrode for blanking said ion beam and which is arranged to form a hole in a material by scanning said ion beam on said material, the improvement comprising a deflection controlling means for controlling said deflector and said blanking electrode so as to change the relationship between d and h from $h \geq d$ to $h << d$ in accordance with an increase in the depth of said hole which is being formed.

13. A focused ion beam apparatus according to claim 12, wherein said deflection controlling means controls the stationary time of said focused ion beam at each deflection point on said material.

14. A focused ion beam apparatus according to claim 13, wherein said deflection controlling means has the function of setting the pitch of deflection of said focused ion beam to a value smaller than the beam diameter.

15. A focused ion beam apparatus according to claim 13, wherein said deflection controlling means has a function of varying the pitch of deflection of said focused ion beam.

16. A focused ion beam apparatus according to claim 13, wherein said deflection controlling means has a function of effecting selection of the scan directions of said focused ion beam.

17. A focused ion beam apparatus according to claim 13, wherein the stationary time of said focused ion beam is controlled in correspondence with the irradiation position of said focused ion beam on said material, the scan direction of said focused ion beam and an aspect ratio of said hole.

* * * * *